United States Patent [19]

Bruce

[11] Patent Number: 5,661,520

[45] Date of Patent: Aug. 26, 1997

[54] ENERGY RESOLVED EMISSION MICROSCOPY SYSTEM AND METHOD

[76] Inventor: Victoria Jean Bruce, 7020 Grand Canyon Dr., #226, Austin, Tex. 78752

[21] Appl. No.: 350,381

[22] Filed: Dec. 5, 1994

Related U.S. Application Data

[63] Continuation of Ser. No. 104,245, Aug. 9, 1993, abandoned, which is a continuation of Ser. No. 827,732, Jan. 28, 1992, abandoned.

[51] Int. Cl.⁶ .............................. H04N 7/18; H04N 9/47; G06K 9/00
[52] U.S. Cl. .............................. 348/92; 348/79; 348/87; 382/141
[58] Field of Search .......................... 382/141, 144–150, 382/260, 261, 265; 348/86, 87, 91, 92, 79, 164

[56] References Cited

U.S. PATENT DOCUMENTS

| | | | |
|---|---|---|---|
| 3,913,128 | 10/1975 | Van den Bosch | 348/370 |
| 3,975,762 | 8/1976 | Van den Bosch | 348/32 |
| 4,125,828 | 11/1978 | Resnick et al. | 382/164 |
| 4,207,554 | 6/1980 | Resnick et al. | 382/133 |
| 4,407,008 | 9/1983 | Schmidt et al. | 348/79 |
| 4,618,938 | 10/1986 | Sandland et al. | 382/148 |
| 4,680,635 | 7/1987 | Khurana | 348/79 |
| 4,755,874 | 7/1988 | Esrig et al. | 348/126 |
| 4,811,090 | 3/1989 | Khurana | 358/93 |
| 5,251,200 | 10/1993 | Hatanaka et al. | 369/126 |

OTHER PUBLICATIONS

Applicant's Submitted Prior Art of FIG. 1 and "Description of Related Art".

*Primary Examiner*—Leo Boudreau
*Assistant Examiner*—Bipin Shalwala
*Attorney, Agent, or Firm*—Jenkens & Gilchrist

[57] ABSTRACT

Emission microscopy software for analyzing an integrated circuit includes one or more subroutines for determining the location of an emission site based upon a powered down background image and a powered up integrated circuit image; one or more subroutines for controlling an optical dispersing apparatus and a CCD camera shutter set on the emission site to obtain photon counts therein; one or more subroutines for correcting data obtained based upon equipment sensitivities; and one or more subroutines for manipulating data relating to light intensity, wavelength, and energy, as well as relating to voltages applied to the integrated circuit.

20 Claims, 4 Drawing Sheets

FIG. 4

| MEANS FOR DETERMINING THE LOCATION OF AN EMISSION SITE ON AN IC | MEANS FOR CONTROLLING AN OPTICAL DISPERSING APPARATUS (SUCH AS A FILTER WHEEL OR A MONOCHROMATOR) AND A CCD CAMERA SHUTTER | |
|---|---|---|
| MEANS FOR CORRECTING DATA BASED UPON EQUIPMENT SENSITIVITIES | MEANS FOR MANIPULATING DATA | |
| MEANS FOR INTERFACING SOFTWARE WITH ELECTRICAL TEST EQUIPMENT | MEANS FOR SAVING DATA TO A HARD DRIVE | MEANS FOR OUTPUTTING DATA TO A PRINTER |

ENERGY RESOLVED EMISSION MICROSCOPY SYSTEM AND METHOD

CROSS REFERENCE TO A RELATED APPLICATION

This is a continuation of application Ser. No. 08/104,245, filed Aug. 9, 1993, now abandoned, which is a continuation of application Ser. No. 07/827,732, filed Jan. 28, 1992 now abandoned.

This application is related to co-pending U.S. patent application Ser. No. 07/826,992, now U.S. Pat. No. 5,301,006 entitled EMISSION MICROSCOPE, which was filed on even date herewith, which has been assigned to the assignee of the present invention, and which is hereby incorporated herein in its entirety by this reference thereto.

BACKGROUND OF THE INVENTION

1. Field of the Invention

The present invention is in the field of applied spectroscopy and, more particularly, in the field of integrated circuit inspection systems.

2. Description of Related Art

It is well known that in integrated circuit (IC) operation, current conduction through a damaged dielectric can cause it to emit extremely faint light. These photoemissions can be detected by the emission microscope disclosed in U.S. Pat. No. 4,680,635 to Khurana, as follows:

1. An IC or other such device ("device") to be tested is placed on a stage of a microscope having a camera associated therewith. A light-tight chamber is closed around the microscope.

2. The device is illuminated and repositioned if necessary within the system so that a particular part of the device to be inspected is positioned in the optic axis of the microscope and camera. Repositioning is effected by an operator viewing the device with a CRT display. The operator is capable of adjusting the Z axis elevation of the microscope stage to improve focus.

3. Next, without applying power, the illuminated device is imaged through a video camera to obtain a "reflected" light top view image of the structural pattern of the device. The reflected image is converted into digital form and stored. Storage is generally effected in a memory. Illumination may be either bright or dark field.

4. The illumination is turned off, and without applying power, any background noise light from the area to be inspected is collected and amplified in the video camera, and optionally in a digital image computer, to obtain a "background" image, which is digitized and stored.

5. Assuming that a defect in the device has previously been detected by some manner of automatic test equipment, a failure condition "test vector" of voltages is applied by manual switches to the I/O terminals of the device, still unilluminated, causing leakage current conducted through defective dielectric features to emit extremely faint visible and infrared light. This emitted light is collected and amplified to obtain an "emitted" light image, which is digitized and stored.

6. The digitized background image is subtracted from the digitized emitted image to produce a "difference" image showing defect emission bright spots, with some noise interference remaining.

7. The difference image is filtered or processed by an image processing computer to further separate emitted light points from the random noise bright points inherent to the very large signal amplification done in the primary camera. This processing is conventionally done on the basis of light intensity, e.g., gray level, threshold discrimination. This filtering produces a "processed difference" image.

8. The "processed difference" image is superimposed over the reflected image of the same area so that photon emission spots can be seen and located with respect to the device. With this information, a process or failure analysis engineer can, afterwards, refer to the composite layout of the device, determine the probably cause of failure, and correct the device design.

Various improvements have been made to emission microscopes such as that disclosed in U.S. Pat. No. 4,680,635. Certain of these improvements are discussed in, e.g., U.S. Pat. Nos. 4,755,874 and 4,811,090. Notwithstanding that improvements have been made, state of the art emission microscopes have a number of shortcomings and deficiencies. Several of these shortcomings and deficiencies relate to the data acquisition process. Succinctly stated, state of the art emission microscope systems lack an intelligently automated data acquisition subsystem.

SUMMARY OF THE INVENTION

The present invention above improves upon the shortcomings and deficiencies of the prior art by providing emission microscopy software that eliminates timely and unnecessary user interaction during the acquisition and analysis of spectral data. More specifically, emission microscopy software according to the teachings of the present invention incorporates a number of improvements designed to enhance the spectral analysis capabilities of prior art emission microscopes. One improvement involves effecting full computer automation of optical dispersing and electrical test apparatus. This improvement acts directly to eliminate unnecessary user interaction during the spectral acquisition process. A second improvement involves storage in memory of calibration factors to automatically correct the intensity data for the spectral response of the assembled apparatus after each set of scans. A third improvement allows storage and recall of spectra for comparison to other spectra or for addition of the photon counts with photon counts from other spectra. Addition of the photon counts from several acquisitions improves the counting statistics. Yet another improvement relates to ability of the improved software according to the teachings of the present invention to be interfaced with electrical test equipment for three dimensional plots of intensity versus wavelength/energy versus applied voltages and for hot election analysis. Still yet another improvement relates to the fact that the software according to the teachings of the present invention includes a subroutine to analyze for hot electron degradation and to predict device lifetimes and failure mechanisms.

Accordingly, it is an object of the present invention to provide improved emission microscopy software.

Another object of the present invention is to eliminate that need to transfer, manipulate, and graph data displayed on a monitor by hand in the emission microscopy art.

BRIEF DESCRIPTION OF THE DRAWINGS

Other objects, advantages, and novel features of the present invention will become apparent from the following detailed description of the invention when considered in conjunction with the accompanying drawings in which:

FIG. 4 is a block diagram of a software system according to the teachings of the present invention.

DETAILED DESCRIPTION OF THE INVENTION

Figure 1:
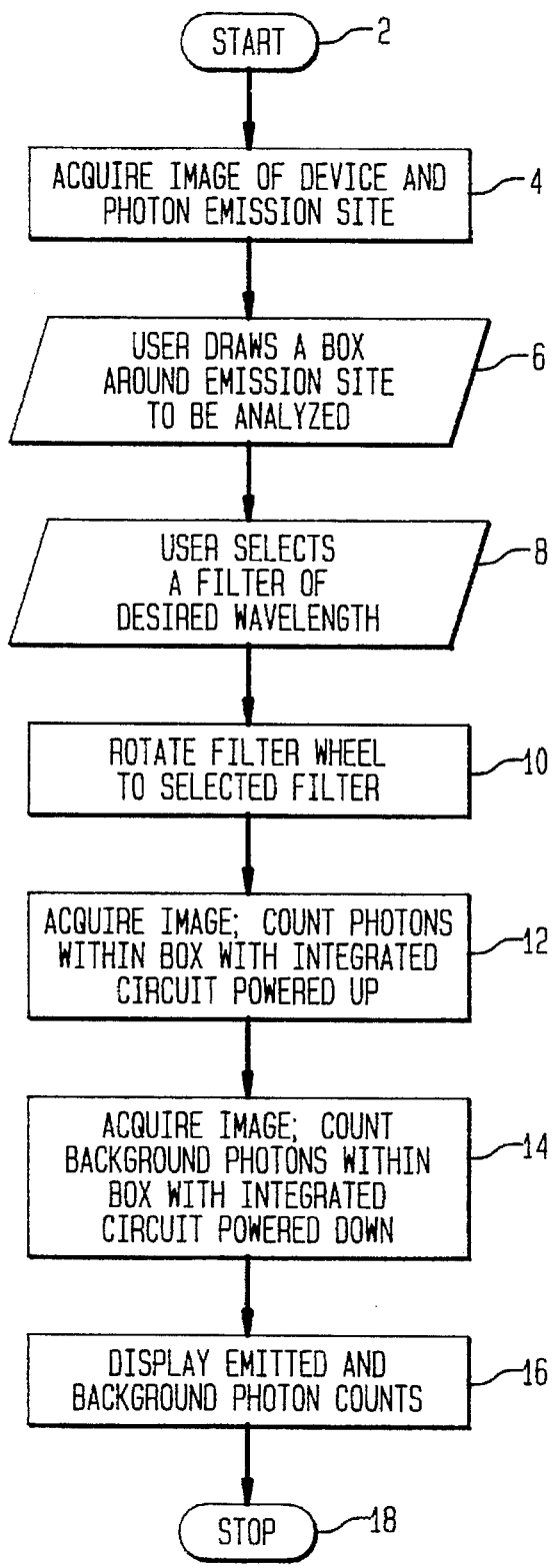
FIG. 1 is a software flowchart typical of state of the art emission microscopes for spectral analysis.

Based upon the description of related art section above, it should be appreciated that energy resolved emission microscopy (EREM) is a diagnostic technique which provides a nondestructive method of determining, for example, which of a multitude of transistors within a device have been weakened by hot electron degradation. As another example, EREM provides a method of gaining insight into oxide conduction mechanisms. Additionally, EREM may also be used to distinguish between reverse and forward biased p-n junctions for diagnostic purposes.

Further based upon the information set forth in the description of related art section above, it should be appreciated that EREM involves the spectral analysis of photons emitted from operating VLSI circuitry. EREM utilizes the fact that the energy state of the channel hot electrons may be approximated by a Maxwell-Boltzmann distribution. Since the spectral distribution of the emitted photon energy reflects the energy of the generating carriers, the photon spectra may be approximated by a Maxwell-Boltzmann distribution as well.

Those skilled in the art presently recognize that the intensity of the photon emission at roughly 200 nm correlates directly to the amount of degradation of the transconductance of the device. Thus, those transistors emitting a large number of visible and near ultraviolet photons at the drain edge are undergoing more severe hot electron degradation. Standard grade microscope optics currently found on state of the art emission microscopes, however, do not transmit ultraviolet radiation. In addition, actual analysis of the low intensity 200 nm photon emission requires long CCD exposure times. Due to the poor signal to noise ratio of the electronically cooled CCD camera and photocathode systems, long exposure times are not possible with the state of the art emission microscope systems.

EREM provides two approaches to obtaining the intensity of the 200 nm photon emission. First, the intensity of the 200 nm photon emission may be measured with the catadioptric microscope, the cryogenically cooled back thinned CCD camera and a long exposure time. Second, the intensity of the 200 nm photon emission may be mathematically estimated from the intensity measured in the visible region using the assumption of a Maxwell-Boltzmann distribution.

The experimental procedure of EREM includes the use of a standard hot electron injection (HEI) stress and test procedure. Both the change in transconductance (or $I_{DSAT}$) and the photon intensity at various wavelengths are plotted against the gate voltage. The gate voltage at which the 200 nm photon intensity is the greatest should correlate to the gate voltage at which the change in transconductance is also the greatest. By plotting the spectral energy against the log of the intensity for each gate voltage at a constant drain voltage, unknown variables in the Maxwell-Boltzmann distribution function for a particular device may be determined. Once these unknown variables are determined, an estimate of the intensity at 200 nm may be easily obtained.

A computer may provide complete automation of the data acquisition process. The data may be automatically corrected for the spectral response of the entire system and displayed graphically in a plot of wavelength versus intensity. The computer may be interfaced with a parametric analyzer for plots of wavelength versus intensity versus voltage. For hot electron analysis, the intensity of the emission at 200 nm and an estimation of the device lifetime may be obtained.

A system including software according to the teachings of the present invention may also encompass the image processing benefits of the state of the art emission microscopes for oxide defects and ESD energy dissipation events. Characteristic spectra may be obtained for various failure mechanisms and may be stored on file and recalled for comparison to spectra obtained from integrated circuitry under analysis.

Referring now to the drawings wherein like reference numerals designate similar identical elements throughout the several views and, more particularly, to FIG. 1, shown therein is a software flowchart of state of the art emission microscopes for spectral analysis. In FIG. 1 it may be seen that such software operates by performing seven separate functions. Upon start 2, the software acquires an image of the device and photon emission site (designated by block 4) to obtain the location of the emission site on the integrated circuit. In a second step, designated by block 6, a system user draws a box around the emission site to be analyzed. As a third step, designated by block 8 in FIG. 1, the user then selects a filter of a desired wavelength. As this filter is undoubtedly on a filter wheel, it is then necessary to rotate the filter wheel to the selected filter. This step is indicated by block 10 in FIG. 1. The next step, indicated by block 12, involves acquiring an image. This step encompasses counting the photons within the box with the integrated circuit having been powered up. The next step, designated by block 14, is similar to the immediately preceding step, except that the integrated circuit is powered down. That is, an image is acquired by counting background photons within the box with the integrated circuit powered down. The next step, designated by block 16, involves displaying the emitted and background photon counts. Once each of the foregoing steps has been accomplished, the data acquisition software has completed its functions and may stop 18.

As discussed in the summary of the invention section above, the inventor of the present invention has developed a number of improvements designed to enhance the spectral analysis capabilities of emission microscopes. One such improvement involves fully computer automating the optical dispersing and electrical test apparatus. Doing this effectively eliminates unnecessary user interaction during the spectral acquisition process. An second improvement entails storing calibration factors in memory to automatically correct the intensity data for the spectral response of the assembled apparatus after each set of scans. A third improvement involves addition of a capability of storing and recalling spectra for comparison to other spectra or for addition of the photon counts with photon counts from other spectra. Addition of the photon counts from several acquisitions improves the counting statistics. A fourth improvement involves the addition of a capability of interfacing the EREM software with electrical test equipment for three dimensional plots of intensity versus wavelength/energy versus applied voltages and for hot electron analysis. A fifth improvement involves including a subroutine within the EREM software to analyze for hot electron degradation and to predict device lifetimes and failure mechanisms.

The five improvements discussed above to emission microscopy software eliminate timely and unnecessary user interaction during the acquisition and analysis of the spectral data. The software improvements eliminate the need to transfer, manipulate and graph data displayed on the monitor by hand.

By way of example only, set forth in the FIGs and described below are detailed flowcharts showing the logic flow in an embodiment of the present invention that has been heretofore developed and used. More specifically, FIG. 2 describes the software flowchart for spectral analysis with a filter wheel used as the optical dispersing apparatus. FIG. 3 describes the software flowchart for spectral analysis with a monochromator as the optical dispersing apparatus.

Figure 2:
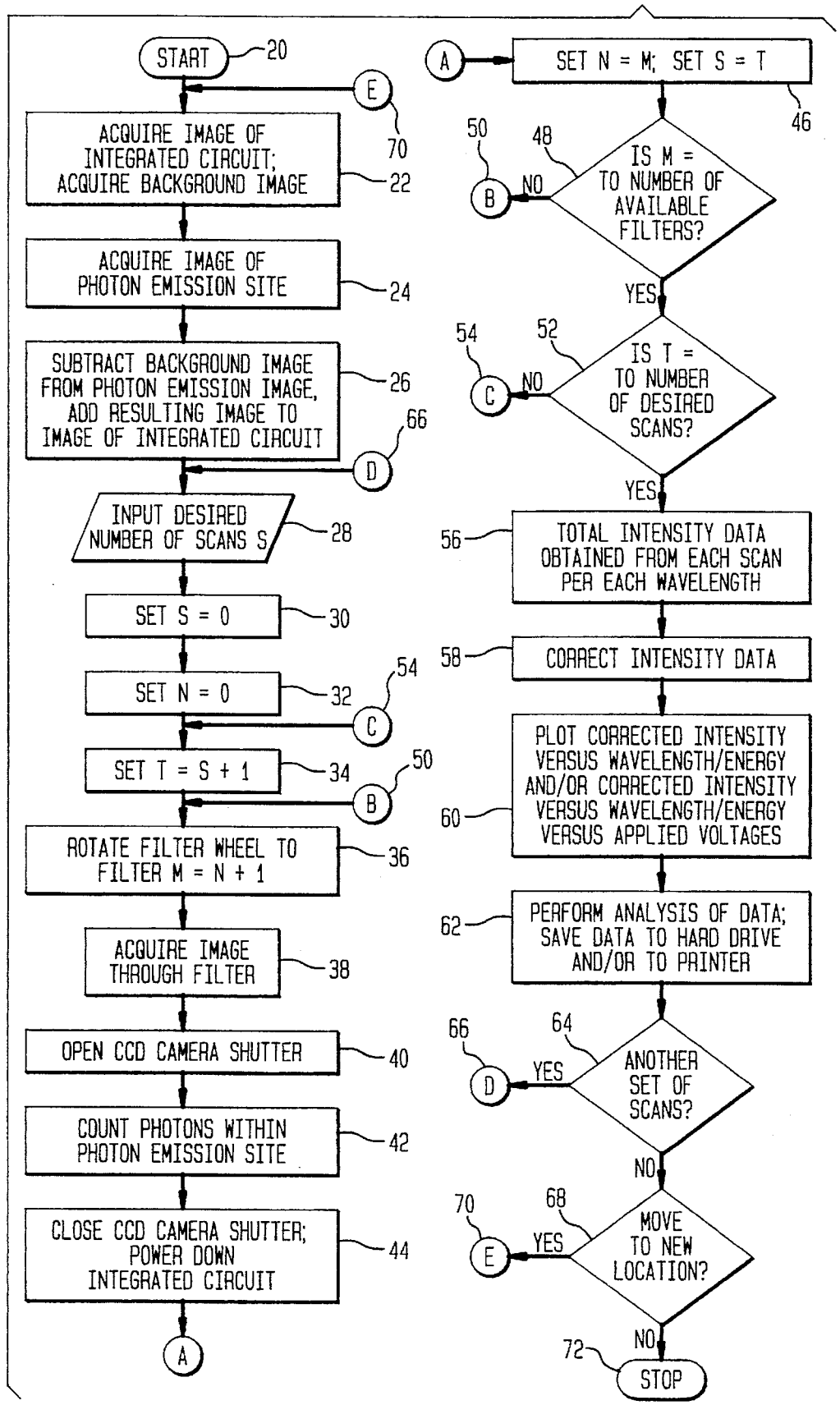
FIG. 2 is a flowchart illustrating logic underlying a filter wheel option according to the teachings of the present invention.
Figure 3:
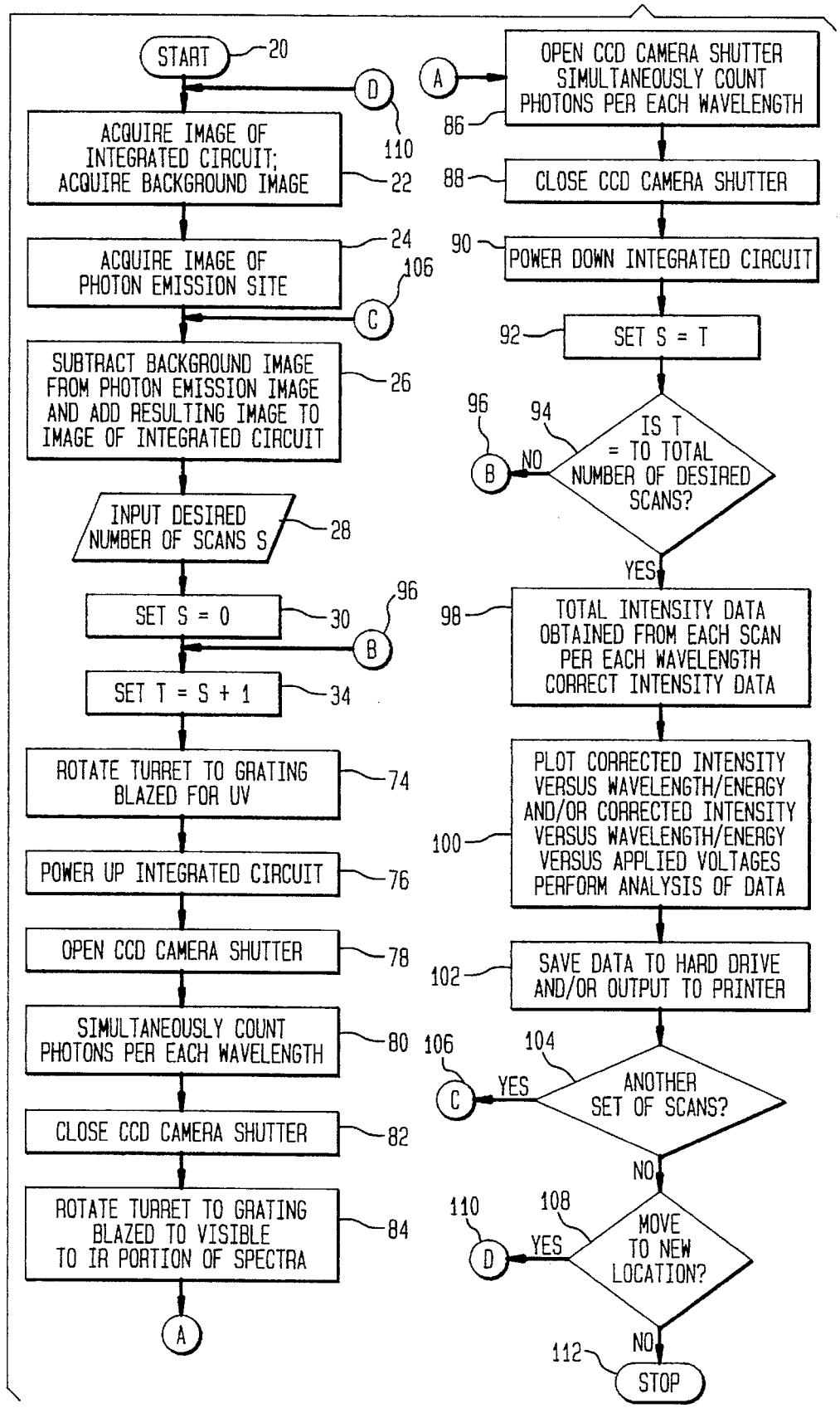
FIG. 3 is a flowchart illustrating logic underlying a monochromator option according to the teachings of the present invention.

Referring now to FIG. 2, the logic underlying a filter wheel may be seen to involve starting 20 and then acquiring an image of an integrated circuit at a desired magnification with low level illumination lights powered on (this step being designated by block 22 in FIG. 2). Step 22 also involves acquiring a background image with the integrated circuit powered down and with low level illumination lights powered off.

The next step in the logic flow of improved EREM software, designated by block 24, encompasses acquiring an image of the photon emission site with the integrated circuit powered up and with any low level illumination lights powered off. This step 24 is immediately followed by the step of subtracting the background image from the photon emission image and adding the resulting image to the image of the integrated circuit to obtain the location of the emission site, this last step being designated by the block numbered 26 in FIG. 2).

The next step involves operator input of a desired number of scans (see block 28). Then, in rapid succession, s is set to equal to zero, n is set equal to zero, and t is set equal to s plus 1. These latter three steps are designated by the blocks numbered 30, 32 and 34, respectively, in FIG. 2. When those steps are completed, the filter wheel is automatically rotated to filter m=n+1 (see block 36).

The next four steps in the logic flow shown in FIG. 2 are acquiring an image through the selected filter with the integrated circuit powered up, opening the CCD camera shutter for the desired integration time, counting the photons within the photon emission site, and closing the CCD camera shutter and powering down the integrated circuit. These four steps are designated by the blocks numbered 38, 40, 42 and 44, respectively, in FIG. 2.

The logic flow then proceeds by setting n=m and s=t (see block 46). Then, a query is made as to whether m is equal to the total number of available filters (see block 48). If no, a logical connection is made back to point B 50, and the filter wheel is rotated. If yes, a query is made as to whether t is equal to the total number of desired scans (see block 52). If no, a logical connection is made back to point C 54, and steps 34 et seq. are reperformed. If the answer to the last query is yes, the next step (designated by the block numbered 56) is performed.

Step 56 encompasses totalling the intensity data obtained from each scan per each wavelength. This data is then (see block 58) corrected for the spectral sensitivity of the apparatus.

Two final substantive steps performed by software according to the teachings of the present invention, steps 60 and 62, respectively, are plotting the corrected intensity versus wavelength/energy and/or corrected intensity versus wavelength/energy versus applied voltages; and performing analysis of the data for hot electron degradation and/or for failure mechanisms. In conjunction with this last substantive step, the data may be saved to a hard drive and/or output to a printer.

After the above two steps, a query is made as to whether or not another set of scans is to be made (see block 64). If yes, a logical connection is made to point D 66 in the flowchart of FIG. 2 and steps 28 et seq. are reperformed. If no, a query is made as to whether to move to a new location on the integrated circuit (see block 68). If yes, a logical connection is made to point E 70 in the flowchart of FIG. 2 and steps 22 et seq. are reperformed. If no, the logic stops (see block 72).

Referring now to FIG. 3, there is shown a software flowchart according to the teachings of the present invention for an EREM monochromator option. Referring to FIG. 3 it may be seen that the logic flow for a monochromator option proceeds identically to the logic flow for a filter wheel option for the first five steps. That is, after starting 20, steps 22, 24, 26, 28, and 30, discussed above with respect to FIG. 2, are performed.

Step 34 is also similarly performed in both the monochromator and filter wheel options; it should be noted, however, the monochromator option of FIG. 3 does not require a step 32 as previously discussed.

After step 34 is performed in the monochromator option of FIG. 3 the monochromator turret is automatically rotated to grating brazed for the ultraviolet to the visible portion of the spectra (see step 74), the integrated circuit is powered up (see step 76), the CCD camera shutter is opened for a desired integrated time (see step 78), photons are simultaneously counted for each wavelength dispersed on the face of the CCD camera (see step 80), and the CCD camera shutter is closed (see step 82). Then the monochromator turret is rotated to grating brazed for the visible to the IR portion of the spectra (see step 84) and once again the CCD camera shutter is opened, photons are simultaneously counted for each wavelength, and the CCD camera shutter is closed (see steps 86 and 88 in FIG. 3). At that point, the integrated circuit is powered down (see step 90) and s is set equal to t (see step 92).

In the next step, step 94, a query is made as to whether t is equal to the total number of desired scans. If no, a logical connection is made to point B 96 and steps 34 et seq. are reperformed. If yes, the intensity data obtained from each scan per each wavelength is totalled (see step 98). Then, the software according to the teachings of the present invention effects plotting of the corrected intensity data versus wavelength/energy and/or corrected intensity data versus wavelength/energy versus applied voltages. Analysis of the data for hot electron degradation and/or for failure mechanisms can then be effected (see step 100). Data can also then be saved to a hard drive and/or output to a printer (see step 102).

After step 102, a query is made as to whether another set of scans should be made (see step 104). If yes, a logical connection is made to point C 106 and steps 26 et seq. are reperformed. If no, a query is made as to whether to move to a new location on the integrated circuit (see step 108). If yes, a logical connection is made to point D 110 and steps 22 et seq. are reperformed. If no, the software has completed its functions and may stop 112.

Those skilled in the art should now fully appreciate, based upon the discussion and examples presented herein, that the present invention provides improved means, in the form of software, for automatically controlling an energy resolved emission microscope. The present invention effects a number of improvements to prior art emission microscopy software, which improvements eliminate timely and unnecessary user interaction during the acquisition and analysis of spectral data. These software improvements eliminate the need to transfer, manipulate and graph data displayed on a monitor by hand. FIG. 4 depicts a block diagram of a possible software system according to the teachings of the present invention.

Those skilled in the art will recognize that many modifications and variations besides those specifically mentioned may be made in the structure and techniques described herein without departing from the concept of the present invention. Accordingly, it should be understood that, within the scope of the appended claims, the present invention may be practiced otherwise than as specifically described herein.

What is claimed is:

1. An emission microscopy software system for analyzing an integrated circuit comprising:
   means for determining a location of an emission site on the integrated circuit based upon a powered down background image and a powered up integrated circuit image;
   means for controlling an optical dispersing apparatus and a CCD camera shutter set on said emission site to obtain photon counts therein;
   means for scanning said emission site at least two times means to determine an emission intensity for each of a plurality of wavelengths from said scans;
   means for correcting data obtained based upon equipment sensitivities; and
   means for simultaneously manipulating data relating to the light intensity, the wavelength, and the energy, as well as relating to voltages applied to the integrated circuit, the computer driven means acting after said means for correcting data acts, wherein said means for determining, said means for controlling, said means for correcting, and said means for simultaneously manipulating are all computer driven.

2. An emission microscopy software system are recited in claim 1, wherein said means for correcting data obtained based upon equipment sensitivities comprises means for comparing calibration factors stored in a memory to intensity data collected.

3. An emission microscopy software system as recited in claim 1, wherein said means for manipulating data relating to light intensity, wavelength, and energy, as well as relating to voltage applied to the integrated circuit comprises means for storing and recalling spectra, means for comparing recalled spectra to other spectra, and means for adding photon counts to photon counts from other spectra.

4. An emission microscopy software system as recited in claim 1, further comprising means for interfacing said software with electrical test equipment to provide three dimensional plots of intensity versus wavelength/energy versus applied voltages.

5. An emission microscopy software system as recited in claim 4, further comprising means for interfacing said software with electrical test equipment for hot electron analysis.

6. An emission microscopy software system as recited in claim 1, wherein said means for manipulating data relating to light intensity, wavelength, and energy, as well as relating to voltages applied to the integrated circuit comprises a subroutine to analyze for hot electron degradation and to predict device lifetimes and failure mechanisms.

7. An emission microscopy software system as recited in claim 1, further comprising means for saving data to a hard drive.

8. An emission microscopy software system as recited in claim 7, further comprising means for outputting data to a printer.

9. An emission microscopy software system as recited in claim 1, wherein said optical dispersing apparatus comprises a filter wheel.

10. An emission microscopy software system as recited in claim 1, wherein said optical dispersing apparatus comprises a monochromator.

11. A method of inspecting an integrated circuit with emission microscopy software, said method comprising the steps of:
    determining the location of an emission site on the integrated circuit based upon a powered down background image and a powered up integrated circuit image;
    controlling an optical dispersing apparatus and a CCD camera shutter set on said emission site to obtain photon counts therein;
    scanning said emission site at least two times;
    determining an emission intensity for each of a plurality of wavelengths from said scans;
    correcting data obtained based upon equipment sensitivities; and
    after said data correction step, simultaneously manipulating data relating to light intensity, wavelength, and energy, as well as relating to voltages applied to the integrated circuit, wherein said step of determining, said step of controlling, said step of correcting, and said step of simultaneously manipulating are all effected by a computer.

12. A method as recited in claim 11, wherein said step of correcting data obtained based upon equipment sensitivities comprises the step of comparing calibration factors stored in a memory to intensity data collected.

13. A method as recited in claim 11, wherein said step of manipulating data relating to light intensity, wavelength, and energy, as well as relating to voltage applied to the integrated circuit comprises the steps of storing and recalling spectra, comparing recalled spectra to other spectra, and adding photon counts to photon counts from other spectra.

14. A method as recited in claim 11, further comprising the step of interfacing said software with electrical test equipment to provide three dimensional plots of intensity versus wavelength/energy versus applied voltages.

15. A method as recited in claim 14, further comprising the step of interfacing said software with electrical test equipment for hot electron analysis.

16. A method as recited in claim 11, wherein said step of manipulating data relating to light intensity, wavelength and energy, as well as relating to voltages applied to the integrated circuit comprises the steps of analyzing for hot electron degradation and predicting device lifetimes and failure mechanisms.

17. A method as recited in claim 11, further comprising the step of saving data to a hard drive.

18. A method as recited in claim 17, further comprising the step of outputting data to a printer.

19. A method as recited in claim 11, wherein said optical dispersing apparatus comprises a filter wheel.

20. A method as recited in claim 11, wherein said optical dispersing apparatus comprises a monochromator.

* * * * *

UNITED STATES PATENT AND TRADEMARK OFFICE
CERTIFICATE OF CORRECTION

PATENT NO.    : 5,661,520
DATED         : Aug. 26, 1997
INVENTOR(S)   : Bruce

It is certified that error appears in the above-identified patent and that said Letters Patent is hereby corrected as shown below:

Column 7, line 23    Replace "times"
                     With --times;--

Signed and Sealed this

Third Day of November, 1998

Attest:

BRUCE LEHMAN

Attesting Officer    Commissioner of Patents and Trademarks